(12) United States Patent
Rief et al.

(10) Patent No.: US 7,609,464 B2
(45) Date of Patent: Oct. 27, 2009

(54) HOLDING DEVICE FOR AN OPTICAL ELEMENT WITH SUPPORT FORCE EQUALIZATION

(75) Inventors: Klaus Rief, Aalen-Oberalfingen (DE); Yuanbo Kong, Esslingen am Neckar (DE)

(73) Assignee: Carl Zeiss SMT AG, Oberkochen (DE)

( * ) Notice: Subject to any disclaimer, the term of this patent is extended or adjusted under 35 U.S.C. 154(b) by 243 days.

(21) Appl. No.: 11/840,568

(22) Filed: Aug. 17, 2007

(65) Prior Publication Data

US 2008/0043349 A1 Feb. 21, 2008

(30) Foreign Application Priority Data

Aug. 17, 2006 (DE) .................. 10 2006 038 634

(51) Int. Cl.
*G02B 7/02* (2006.01)

(52) U.S. Cl. .............. 359/819; 359/811; 359/822
(58) Field of Classification Search ................ 359/811, 359/819, 822, 823, 824; 369/44.14, 44.15; 250/234; 355/67, 72, 75
See application file for complete search history.

(56) References Cited

U.S. PATENT DOCUMENTS

| 4,733,945 | A | 3/1988 | Bacich |
| 6,392,825 | B1 | 5/2002 | Trunz et al. |
| 6,825,998 | B2 | 11/2004 | Yoshida |
| 7,486,382 | B2 * | 2/2009 | Back et al. .............. 355/67 |
| 2004/0257679 | A1 | 12/2004 | Sudoh | |

* cited by examiner

*Primary Examiner*—Hung X Dang
(74) *Attorney, Agent, or Firm*—Fish & Richardson P.C.

(57) ABSTRACT

Holding devices for optical elements, as well as related modules, systems and methods are disclosed. The devices, modules, systems and methods may, for example, be used in the context of microlithography used in manufacturing microelectronic circuits.

42 Claims, 4 Drawing Sheets

Fig. 7

HOLDING DEVICE FOR AN OPTICAL ELEMENT WITH SUPPORT FORCE EQUALIZATION

CROSS-REFERENCE TO RELATED APPLICATION

This application claims priority under 35 U.S.C. §119 to German Patent Application Serial No. 10 2006 038 634.5, filed Aug. 17, 2006, the contents of which are hereby incorporated by reference.

FIELD

The present disclosure relates to holding devices for optical elements, as well as related modules, systems and methods. The disclosure may be used in the context of microlithography used in manufacturing microelectronic circuits.

BACKGROUND

In general, it is desirable in microlithography to hold the components of the optical imaging device.

SUMMARY

In one aspect, the disclosure generally features a device that includes a ring shaped base element, contact elements, and a connecting device. The device is configured to hold an optical element, and the ring shaped base element has a plane of main extension defined by a circumferential direction and a radial direction. The contact elements are configured to contact the optical element, and the contact elements are distributed at a circumference of the base element and connected with the base element so that the contact elements are movable in the radial direction of the base element. The contact elements are connected in the circumferential direction of the base element via the connecting device, and the connecting device couples forces acting on the contact elements in the radial direction of the base element when holding the optical element.

In another aspect, the disclosure generally features an optical module that includes a holding device, a connecting device and an optical element held by the holding device. The holding device includes a ring shaped base element having a plane of main extension being defined by a circumferential direction and a radial direction of the base element. The holding device also includes contact elements configured to contact the optical element. The contact elements are distributed at a circumference of the base element and connected with the base element so that the contact elements are movable in the radial direction of the base element. The contact elements are connected in the circumferential direction of the base element the connecting device, and the connecting device coupling forces acting on the contact elements in the radial direction of the base element when holding the optical element.

In a further aspect, the disclosure generally features a device that includes a mask device configured to receive a mask comprising a projection pattern. The device also includes a substrate device configured to receive a substrate. The device further includes a projection device that includes an optical element group configured to project an image of the projection pattern onto the substrate. The projection device also includes an optical module comprising a holding device and an optical element held by the holding device. The holding device includes a ring shaped base element having a plane of main extension being defined by a circumferential direction and a radial direction of the base element. The holding device also include a plurality of contact elements configured to contact the optical element. The contact elements are distributed at a circumference of the base element and connected with the base element so that the contact elements are movable in the radial direction of the base element. The contact elements are connected in the circumferential direction of the base element via at least one connecting device, and the connecting device coupling forces acting on the contact elements in the radial direction of the base element when holding the optical element.

In an additional aspect, the disclosure generally features a method that includes holding an optical element via a plurality of contact elements of a holding device distributed at a circumference of the optical element. The optical element has a plane of main extension defined by a circumferential direction and a radial direction of the optical element. The contact elements are held in such a manner that they are movable in the radial direction of the optical element when coupling the optical element to the holding device. Via a connecting device connecting the contact elements, a coupling of forces is provided, the forces act on the contact elements in the radial direction of the optical element when holding the optical element.

In some embodiments, the disclosure can provide a holding device configured to hold an optical element and a method for holding an optical element, respectively, which can provide, in a relatively simple manner and with sufficient rigidity of the holding device, a contact pattern of the holding device which is relatively even. This can be achieved, for example, by using a connecting device to substantially equalize the forces acting on the contact elements when holding the optical element.

In some embodiments, the disclosure provides a holding device for an optical element (e.g., an optical element of a microlithography system). The holding device can include a ring shaped base element having a plane of main extension being defined by a circumferential direction and a radial direction of the base element, and a plurality of contact elements for contacting the optical element. The contact elements are arranged distributed at a circumference of the base element and connected with the base element in such a manner that the contact elements are movable in the radial direction of the base element. The contact elements are connected in the circumferential direction of the base element via at least one connecting device, wherein the connecting device couples the forces acting on the contact elements in the radial direction of the base element when holding the optical element. The additional connecting device can substantially equalize the contact forces of the contact elements with the optical element. This can reduce fluctuations and/or differences within the contact forces of the contact elements.

The connecting device may be designed in any suitable manner. It can be designed such that the connecting device couples shifts introduced into the contact elements in the radial direction of the base element upon holding the optical element in opposite directions. If, a contact element (e.g., due to manufacturing tolerances) protrudes with respect to the other contact elements and, consequently, is shifted outward in the radial direction of the base element upon contacting the optical element, the connecting device, due to the coupling of shifts in opposite directions, can help assure that the other contact elements not yet contacting the optical element are shifted radially inward towards the optical element. This can allow all contact elements to contact the optical element at an early stage and, as soon as this is the case, the contact forces can be rendered more even (e.g., substantially equalized) via this coupling.

The connecting device can be designed to work based on tensile forces (e.g., in the manner of a cord or belt). This can allow for relatively simple designs for the connecting device. The connecting device may be arranged to be substantially rigid to tension in the circumferential direction of the base element and to be at least section wise compliant to bending in the radial direction of the base element in order to be able to achieve the force and shift coupling, respectively, in a simple manner.

If the connecting element is designed in the manner of a cord, belt or the like it may also directly contact the contact element. In this case it may be provided that a relative motion is provided between the connecting device and the contact element which is as free from friction as possible. For example, it may be provided that the cord or belt runs in a guiding device, for example, a guiding groove.

In some embodiments, the connecting device is connected to one of the contact elements via a first hinge device including at least one linking hinge. The linking hinge can define a pivot axis running transverse to the plane of main extension of the base element. This can allow for simple relative movement in the circumferential direction of the base element between the connecting device and the contact element.

In certain embodiments, two adjacent contact elements are connected via a connecting elements of the connecting device. The connecting element can be adapted to substantially equalize distance differences between the adjacent contact elements (e.g., to substantially equalize distance differences upon shifting at least one of the contact elements in the radial direction of the base element). This substantial equalization of distances can be effective at any alteration of the distance between the contact elements (e.g., at distance alterations due to thermal expansion) such that in this case no excessive forces are introduced into the contact elements and, ultimately, into the optical element.

This equalization of distances may be achieved in any suitable manner. For example, it may be provided that the connecting element, in an unloaded state, is shaped in the manner of an arc and that the equalising of distance differences occurs by at least local modification of a curvature of the connecting element, consequently, a straightening of the connecting element. Additionally or alternatively, it may also be provided that the connecting element has a substantially straight design, wherein the equalization of distance differences then occurs via a at least local alteration of the length of the connecting element, for example, via an integrated spring element or the like.

The connecting device may be formed as a separate component. The connecting device can be connected monolithically to at least one of the contact elements. This can simplify manufacturing and/or assembly of the holding device and the later assembly of the optical element.

The radial shiftability of the contact elements may be achieved in any suitable manner. For example, the contact elements may be arranged at the base element via an arbitrary longitudinal guide acting in the radial direction. Furthermore, it is possible that, for example, the contact element is connected to the base element via at least one second hinge device having at least one connecting hinge (e.g., a flexure). The connecting hinge may have an arbitrarily oriented pivot axis which allows a corresponding shift of the contact element in the radial direction of the base element. For example, this pivot axis may thus run transverse (e.g., perpendicular) to the plane of main extension of the base element. The connecting hinge can have a pivot axis running tangential to the circumferential direction of the base element. In this case, due to the small required extension of the second hinge device in the circumferential direction of the base element, it is possible to provide a particularly high number of contact elements at the circumference of the base element and, consequently, to achieve a particularly evenly distributed introduction of forces into the optical element.

With certain variants of the holding device according to the disclosure it is provided that the is contact element is arranged as a separate element, wherein the contact element contacts a support surface of the second hinge device. The support surface then runs tangentially to the circumferential direction of the base element and transverse to the radial direction of the base element, wherein it faces outward in the radial direction of the base element Particularly favourable contact conditions can arise if the contact element contacts the support surface with an at least single-curved contact surface (e.g. a single-curved cylinder surface or a bi-curved spherical surface).

The respective contact element, in principle, may be formed as a separate element and a which is connected to the associated second hinge device via a corresponding member. The contact element is arranged to be monolithic with the associated second hinge device since, hereby, manufacturing and later assembly, respectively, are considerably facilitated.

The second hinge device can include at least one element (e.g., a leaf spring element) being connected to the base element and being resilient in the radial direction of the base element. By this approach, at simple manufacture, a particularly good compliance of the contact element in the radial direction of the base element may be achieved. The resilient element can form the at least one connecting hinge of the second hinge device. By this functional integration the design is further simplified.

Here as well it may be provided that the respective second hinge device is formed as a separate component which is connected to the base element via corresponding member(s).

Optionally, the second hinge device can be connected monolithically to the base element in order to considerably simplify manufacturer and/or later assembly.

Fixation of the optical elements with respect to the holding device may occur in any suitable manner via a positive connection and/or a frictional connection and/or a material connection. A clamping device can have at least one clamping element wherein the clamping device is arranged to clamp the optical element between the clamping element and at least one of the contact elements. The clamping element can be adapted to exert a holding force on the optical element which is arranged perpendicular to the plane of main extension of the base element. The clamping device can be connected to the base element.

In some embodiments, the disclosure provides an optical module (e.g., optical modules for microlithography), with a holding device according to the disclosure and an optical element held by the holding device. Herewith the advantages and variants as they have been outlined above may be realised to the same extent such that, in this respect, it is mainly referred to the explanations given above.

The holding device and the optical element may be connected to each other in any suitable manner, e.g. via a positive connection and/or a frictional connection and/or a material connection. The contact elements, after providing the coupling with to the optical element, can be durably connected to each other via a material connection (e.g., an adhesive connection).

In some embodiments, the disclosure provides an optical imaging device (e.g., an optical imaging device for microlithography) including a mask device for receiving a mask including a projection pattern, a projection device including an optical element group and a substrate device for receiving a substrate. The optical element group is adapted to project an image of the projection pattern on the substrate and the projection device includes an optical module according to the disclosure. Herewith as well the advantages and variants as they have been outlined above may be realised to the same extent such that, here as well, it is mainly referred to the explanations given above.

In certain embodiments, the disclosure provides a method of holding an optical element (e.g., an optical element for microlithography) including holding the optical element via a plurality of contact elements of a holding device distributed at a circumference of the optical element. The optical element has a plane of main extension defined by a circumferential direction and a radial direction of the optical element. The contact elements are further held in such a manner that they are movable in the radial direction of the optical element when coupling the optical element to the holding device. Via a connecting device connecting the contact elements, a coupling of the forces is provided that act on the contact elements in the radial direction of the optical element when holding the optical element. Herewith as well the advantages and variants as they have been outlined above may be realised to the same extent such that, here as well, it is mainly referred to the explanations given above.

Embodiments of the disclosure become apparent from the following description, the figures and the claims.

DETAILED DESCRIPTION

Figure 1:
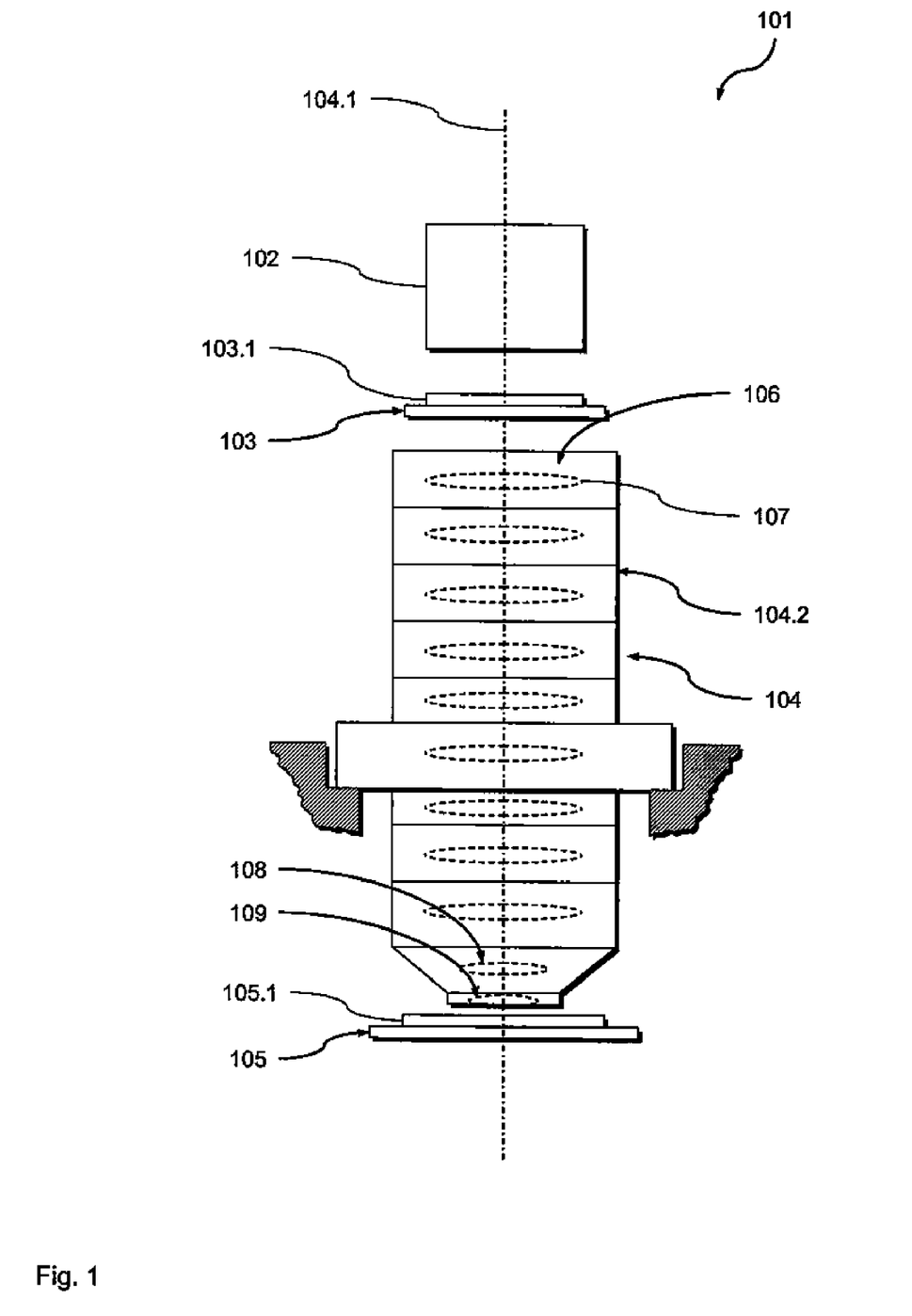
FIG. 1 is a schematic representation of an optical imaging device including an optical module that includes holding device.

FIG. 1 shows a schematic representation of an optical imaging device in the form of a microlithography device 101 operating with light in the UV range at a wavelength of 193 nm.

The microlithography device 101 includes an illumination system 102, a mask device in the form of a mask table 103, an optical projection system in the form of an objective 104 hundred and optical axis 104.1 and a substrate device in the form of a wafer table 105. The illumination system 102, with a projection light beam of the wavelength 193 nm (not shown in further detail), illuminates a mask 103.1 arranged on the mask table 103. The mask 104.1 has a projection pattern which is projected, via the optical elements arranged within the objective 104, onto a substrate in the form of a wafer 105.1 arranged on the wafer table 105.

The objective 104 includes an optical element group 106 which is formed by a series of optical elements 107 to 109.

Due to the operating wavelength of 193 nm the optical elements 107 to 109 are refractive optical elements such as lenses or the like. The optical elements 107 to 109 are held within the housing 104.2 of the objective 104 via corresponding holding devices in combination with which they respectively form an optical module.

Figure 2:
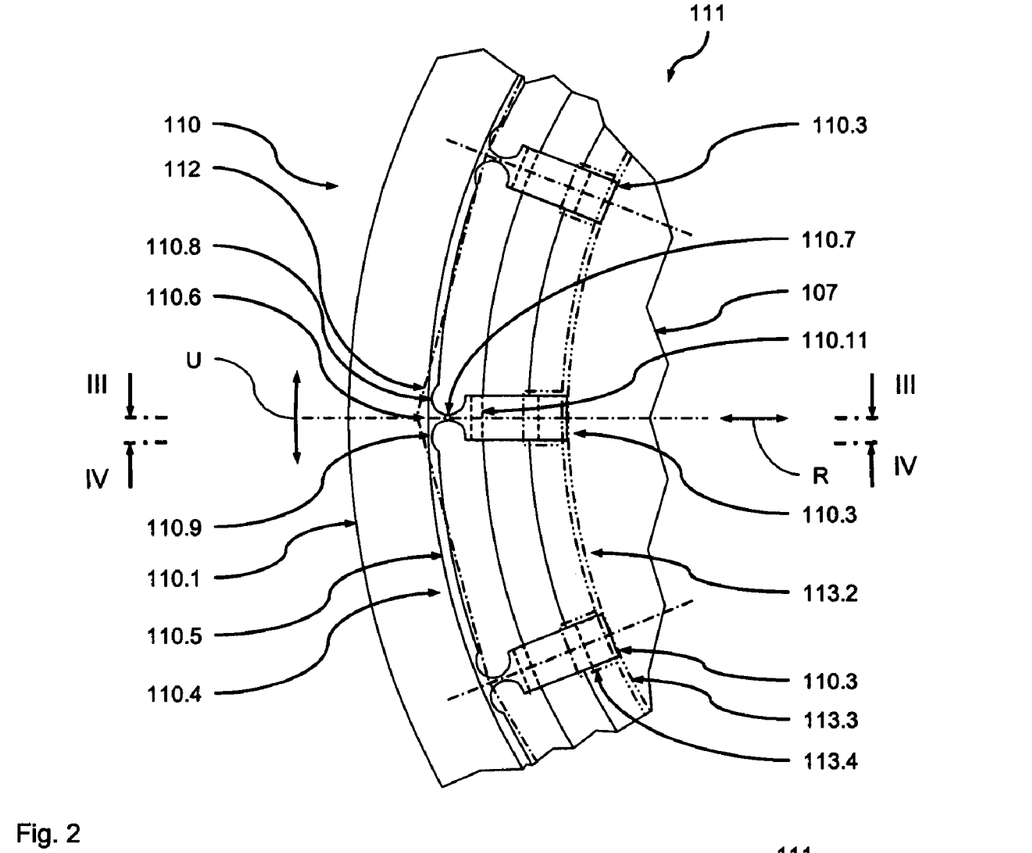
FIG. 2 is a schematic view of a part of the optical module of FIG. 1.
Figure 3:
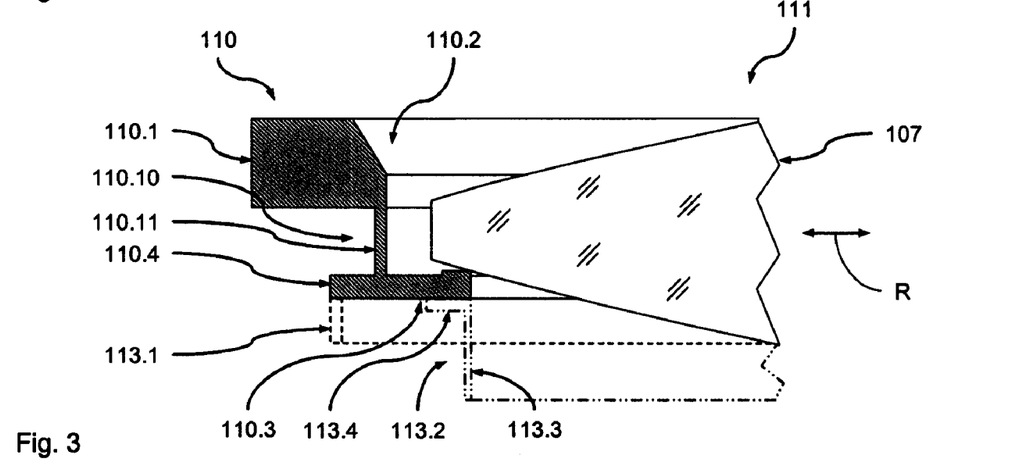
FIG. 3 is a schematic partial section a long line III-III of FIG. 2.

As may be seen from FIGS. 2 and 3, for example, the lens 107 together with a holding device 110 forms an optical module 111. The holding device 110 hereby includes a ring shaped base element 110.1 the plane of main extension of which, in the embodiment shown, runs substantially perpendicular to the optical axis 104.1 and as well as a substantially parallel to the plane of main extension of the lens 107. The plane of main extension of the base element is defined by the circumferential direction U and the radial direction R of the base element 110.1.

At the inner circumference 110.2 of the base element there are distributed (at equal distances) a series of contact elements on which the lens 107 is supported. As will yet be explained in further detail below, the contact elements are connected to the base element 110.1 in such a manner that they are movable in the radial direction R. This radial movability, among others, serves to compensate manufacturing tolerances in the contact area between the respective contact element 110.3 and the lens 107 via a radial compensation movement.

In order to avoid that, as a consequence of such manufacturing tolerances, single contact elements 110.3 are subject to higher loads while, in an extreme case, single contact elements 110.3 are not loaded at all, a connecting device 110.4 was provided which connects the contact elements 110.3 in the circumferential direction U of the base element 110.1. To this end, the connecting device 110.4 includes a series of connecting elements 110.5 one of which respectively connects two adjacent contact elements 110.3 in the circumferential direction U.

The connecting device acts via tensile forces running along the circumferential direction U and, consequently, couples the contact forces acting in the radial direction R on the contact elements 110.3 when holding the lens 107. The coupling of the contact forces here by ensues in such a manner that the shifts of the contact elements 110.3 occurring in the radial direction R when holding the lens 107 are coupled in opposite directions.

If, for example, the middle contact element 110.3 in FIG. 2 (e.g. due to manufacturing tolerances) protrudes in the direction of the lens 107 with respect to the other contact elements 110.3 and, consequently, upon contacting the lens 107, is shifted outward in the radial direction R of the base element 110.1, the connecting device 110.4, due to the coupling of shifts in opposite directions, effects and that the other contact elements 110.3 not yet contacting the lens 107 are shifted radially inward towards the lens 107. This is indicated in FIG. 2 by the dot-dashed contour 112. By this approach, on the one hand, it is achieved about all contact elements 110.3 contact the lens 107 at an early stage and that, as soon as this is the case, the contact forces are rendered more even (e.g., substantially equalized) via this coupling.

In the course of this force and shift coupling, respectively, the outline of the connecting device 110.4 shown in FIGS. 2 and 3 in an idealised circular state (or in a state briefly before the contact between the lens and the contact elements, respectively) modifies to a polygonal outline as it is indicated in FIG. 2 by the contour 112. It is understood that, with other variants of the disclosure, the connecting device may have such a polygonal outline from the outset.

In the embodiment shown, the connecting device 110.4 is arranged at the end of the respective contact elements 110.3 facing away from the lens 107 since, by this approach, a very simple and space saving configuration may be achieved. However, it is understood that, with other variants of the disclosure, it may also be provided that the connecting device is arranged at a different location (e.g., in the area of the contact area between the contact elements and the lens).

In addition, in the present embodiment, the connecting device 110.4 is located substantially in a common plane with the contact elements 110.3. By this approach it is achieved that the forces introduced into the respective contact elements 110.3 via the connecting device 110.4 do substantially not generate a tilting moment (about a tilting axis tangential to the circumferential direction U) which would otherwise tilt the contact elements 110.3 out of this common plane.

However, it is understood that, with other variants of the disclosure, it may also be provided that the connecting device is arranged in such a manner that it exerts such a tilting moment on the contact elements. The arrangement of the connecting device with respect to the plane of the contact elements may be chosen in such a manner that the tilting moment counteracts the tilting moment introduced into the contact elements by the support forces of the lens and, eventually, even compensates the latter. In the present example, to this end, the connecting device would have to be arranged below the plane of the contact elements 110.3 as it is indicated in FIG. 3 by the dashed contour 113.1.

Likewise, with other variants of the disclosure, it may also be provided that such a tilting half the contact elements may be accepted since it contributes to the radial uncoupling between the lens and the base element. The tilting motions occurring thereby are small with respect to the dimensions are the connecting device such that the latter is only negligibly rotated out of its plane of action.

In order to achieve the force and shift coupling, respectively, as it has been outlined above without introducing considerable torsion moments within the plane of main extension into the respective contact element 110.3 and, consequently, into the contact area between the respective contact elements 110.3 and the lens 107, the two connecting elements 110.5 connected to a contact element 110.3 are connected to the associated contact element 110.3 via a first hinge device 110.6.

The first hinge device 110.6 forms three linking hinges 110.7, 110.8 and 110.9 arranged in a non-collinear manner (consequently arranged in a triangle) the pivot axis of which (in the idealized case shown in FIGS. 2 and 3) each runs substantially perpendicular to the plane of main extension of the base element 110.1. While the two outer linking hinges 110.8 and 110.9 predominantly allow angular alterations between the two connecting elements 110.5, the inner linking hinge 110.7 within certain limits also allows a mobility or shift, respectively, I'll be connecting elements 110.5 in the circumferential direction U with respect to the associated contact element 110.3.

It is understood that, with other variants of the disclosure, it may also be provided that the connecting elements are connected to the respective contact element via a different number of linking hinges. Likewise, with a corresponding design of the connecting elements and the connecting device, respectively, it may of course also be provided that any linking hinges are missing.

In order to ensure a sufficiently even force coupling, the respective connecting element 110.5 is arranged to be substantially rigid to tension in the circumferential direction U. In order to compensate distance alterations between the contact elements 110.3 due to arbitrary mechanical and/or thermal influences the respective connecting element is arranged to be sufficiently compliant to bending in the radial direction R. In other words, such distance alterations of the contact elements 110.3 are compensated by an at least local bending open (i.e. an at least local increase in the radius of curvature) of the respective connecting element 110.3.

In order to ensure a defined local bending open, the respective connecting element 110.5 may be provided with a corresponding weakening mechanism (not shown in FIG. 2), e.g. a reduced cross-section or radial slots or the like.

However, it is understood that, with other variants of the disclosure, it may also be provided that the compensation of such distance alterations may ensue via an alteration in the length of the connecting elements. Likewise, a combination of an alteration in length and curvature may of course be provided.

A further protection against introduction of excessive torsion moments within the plane of main extension into the respective contact element 110.3 and, consequently, into the contact area between the respective contact elements 110.3 and the lens 107, lies within the design of the connection of the respective contact element 110.3 to the base element 110.1.

As may be seen from FIGS. 2 and 3, the respective contact element 110.3 is connected to the base element 110.1 via a second hinge device 110.10. The second hinge device 110.10 includes a leaf spring element 110.11 being resilient in the radial direction R, acting as a connecting hinge and providing shiftability of the contact element 110.3 in the radial direction R.

In the present example, the leaf spring element is arranged in such a manner that it defines a connecting hinge with a pivot axis that is tangential to the circumferential direction U. This design has the advantage that the leaf spring element 110.11 requires relatively few space in the circumferential direction U such that, eventually, a relatively large number of contact elements 110.3 may be distributed at the circumference 110.2 of the base element 110.1.

However, it is understood that, with other variants of the disclosure, a connecting hinge with a pivot axis having another orientation may be provided to achieve the shiftability in the radial direction. It is possible to provide a connecting hinge with a pivot axis which is substantially perpendicular to the plane of main extension of the base element as it is known for example from U.S. Pat. No. 4,733,945 (Bacich), the entire disclosure of which is incorporated herein by reference.

The leaf spring element 110.11 (in the idealized state shown in FIGS. 2 and 3) furthermore extends substantially perpendicular to the plane of main extension of the base element 110.1. Due to the comparatively high torsion rigidity of the leaf spring element 110.11 about its longitudinal axis (running substantially perpendicular to the plane of main extension of the base element) the leaf spring element 110.11 counteracts the introduction of excessive torsion moments into the contact area between the respective contact element 110.3 and the lens 107.

Furthermore, due to the arrangement of the leaf spring element 110.11 as outlined above, in the direction of the optical axis 104.1 a comparatively rigid collection of the lens 107 to the housing structure 104.2 of the objective 104 is achieved in an advantageous manner. By this approach, a comparatively high resonant frequency of the holder of the lens 107 can be achieved which has a positive effect with respect to the dynamic imaging errors of the lens 107.

A further advantage of the force and shift coupling according to the disclosure via the connecting device 110.4 lies within the distribution of the radial rigidity of the connection of the lens 107 to the base element 110.1 achieved hereby. If, for example, a given total rigidity of this connection as to be achieved in the radial direction R, a part of this radial rigidity is provided by the connecting device 110.4. This has the advantage that the fraction of the radial rigidity that has to be provided by the connection of the contact elements 110.3 to the base element 110.1 (i.e. by the leaf spring element 110.11) can be smaller than with a conventional design without such a connecting device.

This reduced radial rigidity of the connection of the contact elements 110.3 to the base element 110.1, in turn, has the advantage that upon relative shifts between the lens 107 and the base element 110.1 (as they occur, for example, at different thermal expansion of the lens 107 and the base element 110.1 but also due to mechanical stresses upon integration of the optical module 111 into the objective 104) lower stresses are introduced into the lens 107 via the leaf spring elements 110.11. This, in turn, has a positive effect with respect to the imaging quality that can be achieved.

For holding the lens 107 the latter is first of all laid down onto the contact elements 110.3. At this occasion the connecting device 110.4 substantially equalizes the contact forces acting in the radial direction R between the contact elements 110.3 and the lens 107 as it has been outlined above such that a relatively even contact pattern is achieved between the holding device 110 and the lens 107.

After laying down the lens 107 on to the contact elements 110.3 and adhesive is introduced between the contact elements 110.3 and the lens in order to achieve a material connection between the holding device 110 and the lens 107. However, it is understood that, with other variants of the disclosure, an arbitrary other connection between the lens, i.e. the optical element, and the holding device may be provided as well.

The respective leaf spring element 110.11 is monolithically connected to the associated contact elements 110.3 as well as to the base element 110.1. Consequently, in the present example, the contact elements 110.3 are monolithically connected to the base element 110.1. This has special advantages with respect to the equalization of the contact forces between the contact elements 110.3 and the lens 107 and, consequently, with respect to an improved contact pattern of the holding device 110.

With such a monolithic design considerably narrower manufacturing tolerances can be respected in a simple manner such that already due to the improved geometric boundary conditions a considerably more even distribution of forces over the contact elements is achieved. Furthermore, assembly of the optical module 111 is considerably simplified since no separate assembly and adjustment of single contact elements has to be provided. Eventually, with such a monolithic connection of the contact elements to the base element, at a corresponding manufacturing accuracy, the connecting device may even be missing. In other words, this monolithic connection of the contact elements to the base element represents an individual disclosure (which is independent from the coupling of the contact elements via the connecting device).

A further simplification of the manufacturing of the optical module 111 is achieved in the present example by the monolithic connection of the connecting device 110.4 to the contact elements 110.3. To this end, the respective first hinge device 110.6 is as well monolithically connected with its linking hinges 110.7, 110.8 and 110.9 to the two associated connecting elements 110.5 as well as to the contact element 110.3. By this approach a reliable and durable force and shift coupling between the contact elements 110.3 is achieved in a simple manner.

However, it is understood that, with other variants of the disclosure, it may also be provided that the base element, the first hinge device, the contact element, the second hinge device and the connecting device all or at least in part are formed as a separate components that are connected via corresponding (positive and/or a frictional and/or material) connections to each other.

For example, the contact elements may be individual components individually connected to the base element by a suitable mechanism, for example, a screw connection or the like. Furthermore, with other variants, a plurality of contact elements (together with a suitable carrier element) may be combined to form a separate component (either being a monolithic component or an assembly of separate subcomponents), a plurality of such assemblies (each one including one contact element or a plurality of contact elements) then being mounted to the base element to form the holding device.

After fully completing the adhesive connection between the lens 107 and the contact elements 110.3 a stiffening ring may be mounted to the underside of the contact elements 110.3, e.g. via a further adhesive connection, as it is indicated in FIGS. 2 and 3 by the double-dot-dashed contour 113.2.

The stiffening ring 113.2 includes a thin walled cylindrical or ring shaped, respectively, connecting section 113.3 extending along the circumferential direction of the lens 107 which is connected to the contact elements 110.3. To this end, in the present example, the stiffening ring, at its end facing the contact elements 110.3, includes a number of coupling elements 113.4 corresponding to the number of the contact elements 110.3. The coupling elements 113.4, in the radial direction R, extend outward away from the connecting section 113.3.

The respective cobbling element 113.4 is adhesively connected to the dissociated contact element 110.3 in the area of its surface facing the respective contact element 110.3. However, it is understood that, with other variants of the disclosure, an arbitrary other suitable connection technique may be used for connecting the coupling elements to the associated contact element. Furthermore, it is understood that such coupling elements, with other variants of the disclosure, may also be missing and that the circumferential connecting section may be connected directly to the respective contact element in a suitable manner.

In an advantageous manner, the stiffening ring 113.2 prevents peeling-off stresses within the adhesive connection between the lens 107 and the respective contact element 110.3. Such peeling-off stresses arise upon dynamic loads (e.g., shock loads) of the lens 107 which have, among others, a component perpendicular to the plane of many extension of the lens 107. With such dynamic loads a tilting moment about an axis tangential to the circumferential direction U of the lens 107 arises at the respective contact element 110.3 which results in a so-called peeling-off stress (tensile stress within the adhesive connection on the one radial end of the adhesive connection and compressive stress within the adhesive connection on the other radial end of the adhesive connection) within the adhesive connection between the lens 107 and the respective contact element 110.3.

The stiffening ring 113.2 (thanks to its comparatively high rigidity about an axis tangential to the circumferential direction U of the lens 107) opposes a relatively high resistance to such a tilting moment such that the peeling-off stress within the adhesive connection between the lens 107 and the respective contact element 110.3 is reduced.

Due to the thin walled design of the circumferential connection section 113.3 the latter has a comparatively low bending rigidity about an axis perpendicular to the plane of many extension or the lens 107. Thus, the stiffening ring 113.2 (in a manner similar as outlined above) has the ability to compensate (upon different thermal expansions of the base element 110.1 and the lens 107) distance alterations between the coupling elements 113.4 without introducing considerable stresses into the lens 107. It is understood that, with other variants of the disclosure, this ability to compensate distance alterations may also be provided in any other suitable way, for example, via a plurality of flexures or the like.

Furthermore, it is understood that, in addition or as an alternative, by suitable selection of the coefficient of thermal expansion of the stiffening ring, the introduction of thermally induced stresses into the lens of l only stiffening ring may be prevented or at least reduced. The coefficient of thermal expansion of the stiffening ring may correspond to the coefficient of thermal expansion of the lens is such that a difference in the thermal expansion between the lens and the stiffening ring (otherwise leading to the introduction of stresses into the lens) is avoided. The temperature distribution to be expected during operation may of course be taken into account here as well.

It is understood that the stiffening ring 113.2 as it has been described above may also be used independently from the coupling of the contact elements 110.3 via the connecting device 110.4. Such a stiffening ring may, for example, also be used in combination with arbitrary other contact element arrangements wherein the weight of the optical element is taken by a plurality of contact elements evenly distributed at the circumference of the optical element. Such a stiffening ring may also be used in combination with the contact element arrangements as they have been described within U.S. Pat. No. 4,733,945 (Bacich) or U.S. Pat. No. 6,392,825 B1 (Trunz et al.), U.S. Pat. No. 6,825,998 (Yoshida) and US 2004/0257679 A1 (Sudoh), each of which is hereby incorporated by reference. In other words, the connection of such a stiffening ring to the contact elements represents a separate disclosure which is independent from the coupling of the contact elements via the connecting device.

Figure 4:
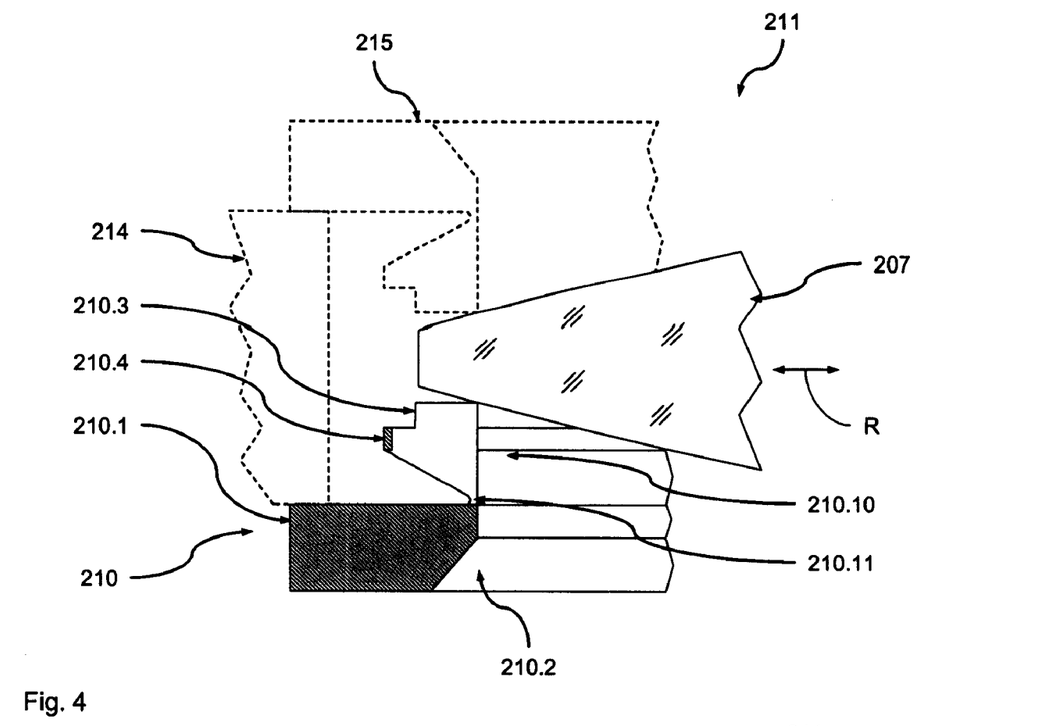
FIG. 4 is a schematic section through part of an optical module.

Referring to FIG. 4, an optical module 211 includes a holding device 210. The optical module 211 may replace the optical module 111 within the microlithography device 101 of FIG. 1. FIG. 4 shows a section through the optical module 211 the location of which corresponds to the section line IV-IV of FIG. 2.

The holding device 210, in its general design and its general functionality, corresponds to the holding device 110 of FIGS. 2 and 3. The holding device 210 as well includes a plurality of contact elements 210.3 being evenly distributed at the inner circumference 210.2 of the base element 210.1 and supporting the lens 207. Thus, it shall here be made reference to the explanations given above and be mainly concentrated on the differences.

An essential difference with respect to the embodiment of FIGS. 2 and 3 lies within the design of the second hinge device 210.10 via which the respective contact element 210.3 is connected to the base element 210.1. As may be seen from FIG. 4, the second hinge device 210.10 is formed by a single flexure 210.11 the pivot axis of which runs parallel to the plane of main extension of the base element 210.1 and tangential to the circumferential direction U.

It is a consequence of this design that the radial rigidity of the connection of the lens 207 to the base elements 210.1 is nearly fully determined by the connecting device 210.4 which corresponds to the connecting device 110.4 of FIG. 2 and, consequently, is designed in the manner as it has been described above in the context of the first embodiment. Thus, by this approach, a particularly good uncoupling of radial shifts (e.g., thermally induced radial shifts) between the base element 210.1 and the lens 207 is achieved.

The base element may be connected (e.g. via a positive and/or a frictional and/or a material connection) to a suitable carrier element (indicated in FIG. 4 by the dashed contour 214) of the housing structure 104.2 of the objective 104.

For fixation of the lens 207 it may be again provided that the latter is adhesively connected in its contact area with the contact elements 210.3. As it is indicated in FIG. 4 by the dashed contour 215, it may also be provided that the lens 207 is clamped between the holding device 210 and a further holding device 215 identical to the former but rotated by 180°. The further holding device 215 is then connected to the holding device 210, e.g. also mounted to the carrier element 214.

This configuration, on the one hand, has the advantage that potential lifetime and soiling problems eventually associated to an adhesive connection are avoided. Furthermore, with such a configuration and it is possible without any problems to hold the optical element, i.e. the lens 207 in the present example, in an orientation that deviates from the horizontal orientation as it is shown. It is here with possible to hold the lens in a standing configuration (i.e. with an optical axis extending horizontally). In this case, the connecting devices of the holding devices 210 and 215, via the force and shift coupling of the contact elements 210.3 as outlined above, provide an equalization of the contact forces such that even with such an orientation deviating from the horizontal orientation and equalization of the contact forces and, thus, an even contact pattern can be achieved when holding the lens 207. Thus, critical design elements are evenly loaded. Furthermore, a non rotationally symmetric drift behavior, such as for example gravity induced adhesive drift, can be largely avoided herewith.

Figure 5:
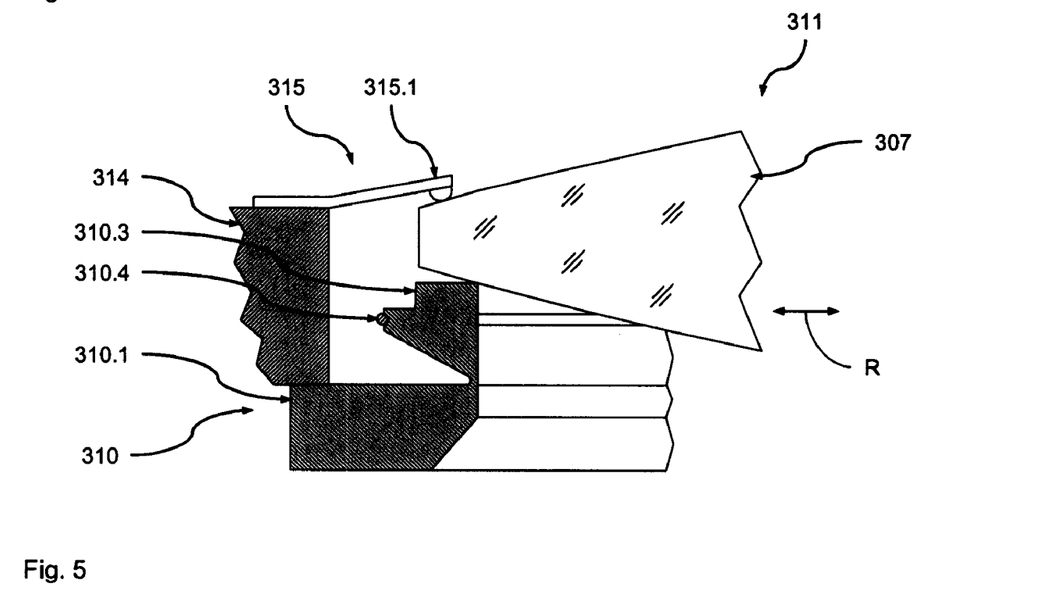
FIG. 5 is a schematic section through part of an optical module.

Referring to FIG. 5, an optical module 311 includes a holding device 310. The optical module 311 may replace the optical module 111 within the microlithography device 101 of FIG. 1. FIG. 5 shows a section through the optical module 311 the location of which corresponds to the section line III-III of FIG. 2.

The holding device 310, in its general design and its general functionality, corresponds to the holding device 210 of FIG. 4. The holding device 310 as well includes a plurality of contact elements 310.3 being evenly distributed at the inner circumference 310.2 of the base element 310.1 and supporting the lens 307. Thus, it shall here be made reference to the explanations given above and be mainly concentrated on the differences.

An essential difference with respect to the embodiment of FIG. 4 lies within the design of the connecting device 310.4 which, in the present example, is designed as a separate wire ring of circular cross-section. The wire ring 310.4 is put from outward onto the backside of the contact elements 310.3, wherein it is respectively received within a corresponding groove within the contact element 310.3. The wire ring and/or the groove within the contact element 310.3 may respectively be provided with a corresponding coating or the like which reduces friction between the wire ring 310.4 and the contact element 310.3.

Similar to the connection device 110.4 of FIG. 2 the wire ring 310.4 is substantially rigid to tension in the circumferential direction U while it is compliant to bending in the radial direction R. The wire ring 310.4, in an unloaded state, as well as a circular shape which changes to a polygonal shape under load, i.e. when laying down the lens 307 onto the contact elements 310.3. Depending on the necessary distance compensation between the contact elements 310.3 the wire ring 310.4 has more or less strongly curved sections between its kinks.

This design has the advantage of particularly simple manufacture since the wire ring 310.4 may be manufactured separately in a simple manner and has only to be snapped into the grooves of the contact elements 310.3.

Here as well, the base element may be connected by a suitable mechanism (e.g. via a positive and/or frictional and/or material connection) to a suitable carrier element 314 of the housing structure 104.2 of the objective 104.

For fixation of the lens 307 it may again be provided that the latter is adhesively connected in its contact area to the contact elements 310.3. As may be seen from FIG. 5, the lens 307 is clamped between the holding device 310 and a clamping device 315 connected to the carrier element 314. The clamping device 315 includes a plurality of clamping elements 315.1 distributed along the circumferential direction U and associated to at least single ones of the contact elements 310.3 and exerting a corresponding clamping force on the lens 307. This configuration again has the advantage that potential lifetime and soiling problems eventually associated to an adhesive connection are avoided. The camping elements 315.1 of the clamping device 315 may be very compliant such that a force variation due to manufacturing tolerances is minimised and, in other words, a clamping that is as even as possible is achieved.

Figure 6:
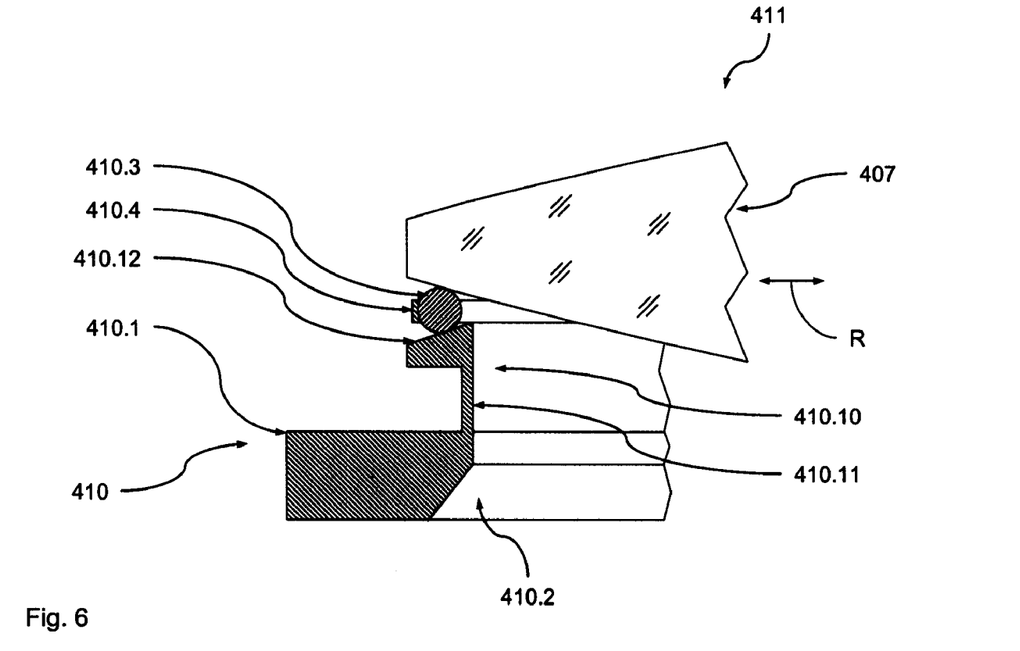
FIG. 6 is a schematic section through part of an optical module.

Referring to FIG. 6, an optical module 411 includes a holding device 410. The optical module 411 again may replace the optical module 111 within the microlithography device 101 of FIG. 1. FIG. 5 shows a section through the optical module 311 the location of which corresponds to the section line III-III of FIG. 2.

The holding device 410, in its general design and its general functionality, corresponds to the holding device 210 of FIG. 4. The holding device 410 as well includes a plurality of contact elements 410.3 being evenly distributed at the inner circumference 410.2 of the base element 410.1 and supporting the lens 407. Thus, it shall here be made reference to the explanations given above and be mainly concentrated on the differences.

An essential difference with respect to the embodiment of FIG. 4 lies within the design of the contact elements 410.3. The contact elements 410.3 are designed as separate ball shaped (i.e. double curved) components each being supported on a support surface 410.12 of the associated second hinge device 410.10.

The support surface 410.12 extends tangentially with respect to the circumferential direction U of the base element 410.1 and transverse (in the present example inclined by an angle of about 20°) to the radial direction of the base element wherein it faces outward in the radial direction R. When placing the lens 407, on the one hand, the contact elements may give way to the outside in the radial direction R. Likewise, the leaf spring element 410.11 of the second hinge device 410.10 may be shifted in the radial direction R to the inside at this occasion.

The connecting device 410.4 here as well provides the force and shift coupling between the contact elements as it has been sufficiently outlined above. A difference with respect to the embodiment of FIG. 4 lies within the design of the connecting device 410.4 which, in the present example, is designed to see separate ring shaped belt having his slightly bow shaped cross-section. The belt 410.4 is put from outwards onto the backside of the contact elements, wherein it snugly fits to the respective contact element 410.3 with its bow shaped inner contour. The belt 410.4 and/or the contact element 410.3 may respectively be provided with a corresponding coating or the like which reduces friction between the belt 410.4 and the contact element 410.3.

Similar to the connecting device 110.4 of FIG. 2 the belt 410.4 is substantially rigid to tension in the circumferential direction U while it is compliant to bending in the radial direction R. Likewise, the belt 410.4, in an unloaded state, has a circular shape which changes to a polygonal shape under load, i.e. when laying down the lens 407 onto the contact elements 410.3. Depending on the necessary distance compensation between the contact elements 410.3 the belt 410.4 has more or less strongly curved sections between its kinks.

This design has the advantage of particularly simple manufacture since the belt 410.4 may be manufactured separately in a simple manner and only has to be put on to be contact elements 410.3 from the outside.

For fixation of the lens 407 it may again be provided that the latter, after adjusting its optical axis, is adhesively connected in its contact area with the contact elements 410.3. The contact elements 410.3 can be adhesively connected to the second hinge device is 410.10 in order to fully fixate the arrangement. However, it is understood that, with other variants of the disclosure, a damping connection or the like may again be provided.

Figure 7:
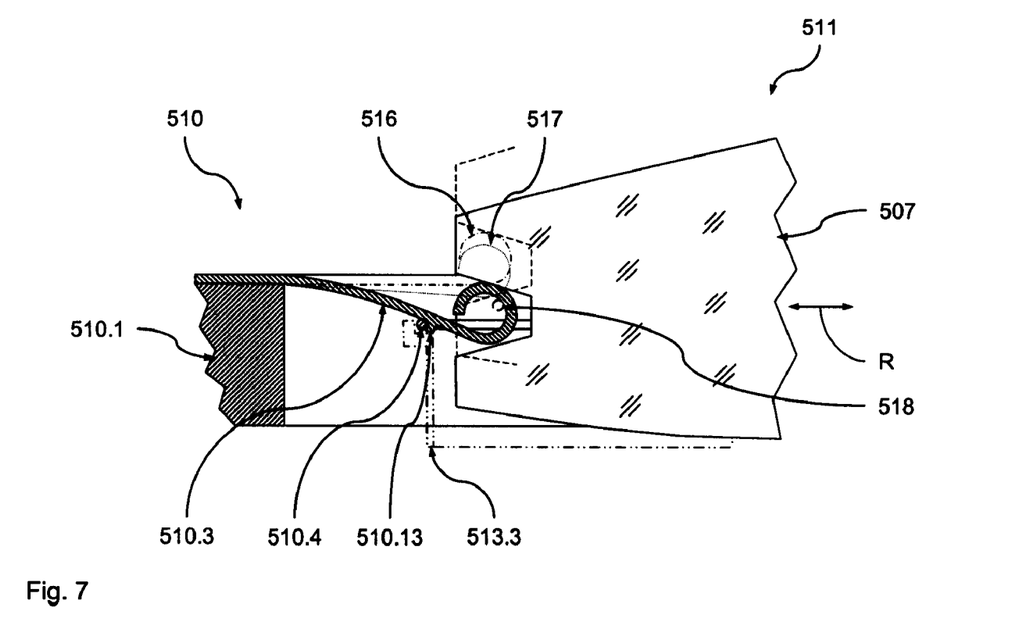
FIG. 7 is a schematic section through part of an optical module.

Referring to FIG. 7, an optical module 511 includes a holding device 510. The optical module 511 may replace the optical module 111 within the microlithography device 101 of FIG. 1. FIG. 7 shows a section through the optical module 511 the location of which corresponds to the section line III-III of FIG. 2.

The holding device 510, in its general design and its general functionality, corresponds to the holding device 110 of FIGS. 2 and 3. The holding device 510 as well includes a plurality of contact elements 510.3 being evenly distributed at the inner circumference 510.2 of the base element 510.1 and supporting the lens 507. Thus, ft shall here be made reference to the explanations given above and be mainly concentrated on the differences.

One essential difference with respect to the embodiment of FIGS. 2 and 3 lies within the design of the contact elements 510.3. Each contact element 510.3 is a separate component individually mounted to the base element 510.1 (e.g. via a screw connection or any other suitable connection). Each contact element 510.3 is a leaf spring element with a rolled up end facing the lens 507 to form a generally cylinder shaped contact section reaching into a circumferential generally V-shaped groove within the lens 507. The general design of such a holding device of such contact elements, is disclosed in US 2004/0257679 A1 (Sudoh), for example.

A further essential difference with respect to the embodiment of FIGS. 2 and 3 lies within the design of the connecting device 510.4 which, in the present example, is designed as a separate wire ring of circular cross-section. The wire ring 510.4 is put from below onto the lower side of the contact elements 510.3, wherein it abuts against a corresponding protrusion 510.13 formed on the lower side of the respective contact element 510.3. The wire ring and/or the protrusion 510.13 on the contact element 510.3 may respectively be provided with a corresponding coating or the like which reduces friction between the wire ring 510.4 and the contact element 510.3.

Similar to the connection device 110.4 of FIG. 2 the wire ring 510.4 is substantially rigid to tension in the circumferential direction U while it is compliant to bending in the radial direction R. The wire ring 510.4, in an unloaded state, as well as a circular shape which changes to a polygonal shape under load, i.e. when loading the contact elements 510.3 with the weight of the lens 507. Depending on the necessary distance compensation between the contact elements 510.3 the wire ring 510.4 has more or less strongly curved sections between its kinks.

This design has the advantage of particularly simple manufacture since the wire ring 510.4 may be manufactured separately in a simple manner and has only to be snapped onto the protrusions 510.13 of the contact elements 510.3. However, it is understood that, with other variants of the disclosure, any other suitable connection between the connecting element and the contact element may be chosen.

The wire ring 510.4, via its force and shift coupling as it has been outlined above, provides an equalization of the contact forces of the contact elements 510.5 and, thus, a substantially even contact pattern of the holding device 510 holding the lens 507. This equalization is useful and effective despite the individual radial adjustability (i.e. adjustability in the radial direction R of the base element 510.1) of the respective contact element 510.3.

This is due to the fact that despite the individual radial adjustability of the respective contact element 510.3 individual contact elements 510.3 (e.g. due to manufacturing tolerances) may only contact the upper flank of the V-shaped groove within the lens 507 as it is indicated by the dashed contour 516 in FIG. 7 while other ones of the contact elements 510.3 (e.g. due to manufacturing tolerances) may only contact the lower flank of the V-shaped groove within the lens 507 as it is indicated by the dotted contour 517 in FIG. 7. When loading the contact elements 510.3 with the weight of the lens 507, in extreme cases, only the contact elements 510.3 initially contacting only the upper flank (contour 516) would exert a contact force on the lens 507 while the contact elements 510.3 initially contacting only the lower flank (contour 517) might even exert no force at all onto the lens 507 which would lead to an undesired uneven contact pattern between the holding device 510 and the lens 507. However, with the disclosure, this unfavourable situation is prevented by the force and shift coupling provided via the wire ring 510.4.

Here as well, the base element 510.1 may be connected by a suitable mechanism (e.g. via a positive and/or frictional and/or material connection) to a suitable carrier element 514 of the housing structure 104.2 of the objective 104.

For fixation of the lens 307 it may again be provided that the latter is adhesively connected in its contact area to the contact elements 510.3. However, with other embodiments of the disclosure, a fixation using a plurality of spherical fixation elements rigidly connected to the base element 510.1 and reaching into the V-shaped groove within the lens 507 may be used as it is known from previously mentioned US 2004/0257679 A1 (Sudoh), for example.

Furthermore, as it is indicated in FIG. 7 by the dashed contour 513.3, here as well a stiffening ring may be connected to the contact elements 510.3 in a manner as it has been described above in the context of the first embodiment.

Finally, it will be appreciated that, with other embodiments of the disclosure the connecting device may be connected to the contact elements as any other suitable location. Furthermore, for example, it is also possible that the connecting device may be formed by a wire ring that is formed by guiding a corresponding wire through the eyes formed by the contact sections of the (mounted) contact elements as it indicated in FIG. 7 by the dashed contour 518. The open ends of the wire may then be connected to form the wire ring (thereby applying a suitable tension within the wire ring).

In the foregoing, the present disclosure has been described in the context of examples where the optical elements held by the holding device according to the disclosure are exclusively refractive optical elements. It is to be noted here however that the disclosure (e.g., in the case of an imaging at different wavelengths) of course may also be used with optical element groups which include exclusively or in an arbitrary combination refractive, reflective or diffractive optical elements.

Furthermore, it is to be noted that, in the foregoing, the present disclosure has been described in the context of examples in the area of microlithography. However, it is understood that the present disclosure may also be used for arbitrary other applications and imaging methods, respectively.

What is claimed is:

1. A device, comprising:
   a ring shaped base element;
   contact elements; and
   a connecting device
   wherein:
      the device is configured to hold an optical element;
      the ring shaped base element has a plane of main extension defined by a circumferential direction and a radial direction;
      the contact elements are configured to contact the optical element;
      the contact elements are distributed at a circumference of the base element and connected with the base element so that the contact elements are movable in the radial direction of the base element;
      the contact elements are connected in the circumferential direction of the base element via the connecting device; and
      the connecting device couples forces acting on the contact elements in the radial direction of the base element when holding the optical element.

2. The device according to claim 1, wherein the connecting device couples shifts introduced into the contact elements in the radial direction of the base element upon holding the optical element in opposite directions.

3. The device according to claim 1, wherein the connecting device is arranged to substantially equalize forces acting on the contact elements in the radial direction of the base element.

4. The device according to claim 1, wherein the connecting device couples forces acting on the contact elements via tensile force.

5. The device according to claim 1, wherein the connecting device is arranged to be substantially rigid in the circumferential direction of the base element and to be at least section wise compliant to bending in the radial direction of the base element.

6. The device according to claim 1, wherein the connecting device is connected to one of the contact elements via a first hinge device comprising at least one linking hinge.

7. The device according to claim 6, wherein the linking hinge defines a pivot axis running transverse to the plane of main extension of the base element.

8. The device according to claim 6, wherein the first hinge device comprises at least three linking hinges, and the at least three linking hinges are arranged in a non collinear manner.

9. The device according to claim 8, wherein:
   for a first contact element, a first hinge device is linked via a first linking hinge to the first contact element;
   for a second contact element adjacent the first contact element, a second hinge device is linked via a second linking hinge to the second contact element;
   the first and second hinge devices are connected via a connecting element of the connecting device; and the connecting element is respectively connected to a second linking hinge of the first hinge device.

10. The device according to claim 1, wherein two adjacent contact elements are connected via a connecting element of the connecting device, and the connecting element is configured to:
equalize distance differences between the two adjacent contact elements;
equalize distance differences upon shifting at least one of the contact elements in the radial direction of the base element; or
both equalize distance differences between the two adjacent contact elements and equalize distance differences upon shifting at least one of the contact elements in the radial direction of the base element.

11. The device according to claim 10, wherein the connecting element, in an unloaded state, is shaped in the manner of an arc, and the equalising of distance differences occurs by at least local modification of a curvature of the connecting element.

12. The device according to claim 1, wherein the connecting device, in the radial direction of the base element, is arranged on an outer side of the contact elements.

13. The device according to claim 1, wherein the connecting device is connected in a monolithic manner to at least one of the contact elements.

14. The device according to claim 1, wherein a contact element is connected to the base element via a hinge device, the hinge device comprises at least one member selected from the group consisting of a connecting hinge and a flexure, and the connecting hinge has a pivot axis running tangentially to the circumferential direction of the base element.

15. The device according to claim 14, wherein the contact element is a separate element from the hinge device, the contact element contacts a support surface of the hinge device, and the support surface runs tangentially to the circumferential direction of the base element and transverse to the radial direction of the base element and faces outward in the radial direction of the base element.

16. The device according to claim 15, wherein the contact element contacts the support surface with an at least single-curved contact surface.

17. The device according to claim 14, wherein the contact element is monolithic with the hinge device.

18. The device according to claim 14, wherein the hinge device comprises at least one resilient element connected to the base element, and the at least one resilient element is resilient in the radial direction of the base element.

19. The device according to claim 18, wherein the at least one resilient element forms the connecting hinge of the second hinge device.

20. The device according to claim 14, wherein a second hinge device is connected in a monolithic manner to the base element.

21. The device according to claim 1, further comprising a damping device having at least one clamping element is provided, wherein the damping device is configured to clamp the optical element between the clamping element and at least one of the contact elements.

22. The device according to claim 21, wherein the clamping device is connected to the base element.

23. The device according to claim 1, wherein the optical element is configured to be used in a microlithography system.

24. A microlithography system comprising the device of claim 1.

25. An optical module, comprising:
a holding device, comprising:
a ring shaped base element having a plane of main extension being defined by a circumferential direction and a radial direction of the base element; and
contact elements configured to contact the optical element;
a connecting device; and
an optical element held by the holding device,
wherein:
the contact elements are distributed at a circumference of the base element and connected with the base element so that the contact elements are movable in the radial direction of the base element;
the contact elements are connected in the circumferential direction of the base element the connecting device; and
the connecting device coupling forces acting on the contact elements in the radial direction of the base element when holding the optical element.

26. The optical module according to claim 25, wherein each of the contact elements of contacts the optical element in a contact area, and the contact elements are connected to the optical element in the contact area via an adhesive connection.

27. The optical module according to claim 25, wherein the contact elements are connected to each other via a stiffening ring.

28. The optical module according to claim 25, further comprising a clamping device with a clamping element, and the clamping device is arranged to clamp the optical element between the clamping element and at least one of the contact elements.

29. The optical module according to claim 28, wherein:
the holding device is a first holding device;
the clamping device is formed by a second holding device;
the second holding device comprises a ring shaped second base element having a plane of main extension being defined by a circumferential direction and a radial direction of the second base element and a plurality of second contact elements for contacting the optical element;
the second contact elements are distributed at a circumference of the second base element and connected with the second base element in such a manner that the second contact elements are movable in the radial direction of the second base element;
the second contact elements are connected in the circumferential direction of the second base element via at least one second connecting device;
the second connecting device couples forces acting on the second contact elements in the radial direction of the second base element when holding the optical element; and
the optical element being clamped between a least one of the contact elements of the first holding device and at least one of the second contact elements of the second holding device.

30. The optical module according to claim 25, wherein the optical module is configured to be used in a microlithography system.

31. A microlithography system comprising the optical module of claim 25.

32. A device, comprising:
a mask device configured to receive a mask comprising a projection pattern;
a substrate device configured to receive a substrate; and
a projection device, comprising:

an optical element group configured to project an image of the projection pattern onto the substrate; and an optical module comprising a holding device and an optical element held by the holding device, wherein:

the holding device comprises:

a ring shaped base element having a plane of main extension being defined by a circumferential direction and a radial direction of the base element; and a plurality of contact elements configured to contact the optical element;

the contact elements are distributed at a circumference of the base element and connected with the base element so that the contact elements are movable in the radial direction of the base element;

the contact elements are connected in the circumferential direction of the base element via at least one connecting device; and the connecting device coupling forces acting on the contact elements in the radial direction of the base element when holding the optical element.

33. The device according to claim 32, wherein the device is configured to be used in a microlithography system.

34. A microlithography system comprising the device of claim 32.

35. A method, comprising:

holding an optical element via a plurality of contact elements of a holding device distributed at a circumference of the optical element, wherein:

the optical element has a plane of main extension defined by a circumferential direction and a radial direction of the optical element; and the contact elements are held in such a manner that they are movable in the radial direction of the optical element when coupling the optical element to the holding device; and via a connecting device connecting the contact elements, a coupling of forces is provided, the forces act on the contact elements in the radial direction of the optical element when holding the optical element.

36. The method according to claim 35, wherein, via the connecting device, shifts introduced into the contact elements in the radial direction of the base element upon holding the optical element are coupled in opposite directions.

37. The method according to claim 35, wherein via the connecting device the forces acting on the contact elements in the radial direction when holding the optical element are substantially equalized.

38. The method according to claim 35, wherein the connecting device is configured to use tensile force to act on the contact elements.

39. The method according to claim 35, wherein the connecting device at least partially equalizes distance differences between adjacent ones of the contact elements caused by shifts of the contact elements.

40. The method according to claim 35, wherein the contact elements are at least one of connected and adhesively bonded to the optical element, and, subsequently, the contact elements are connected to each other via a stiffening ring.

41. The method according to claim 40, wherein the stiffening ring is adhesively bonded to the contact elements.

42. The method of claim 35, wherein the optical element is configured to be used in a microlithography system.

* * * * *

UNITED STATES PATENT AND TRADEMARK OFFICE
CERTIFICATE OF CORRECTION

| | | |
|---|---|---|
| PATENT NO. | : 7,609,464 B2 | Page 1 of 1 |
| APPLICATION NO. | : 11/840568 | |
| DATED | : October 27, 2009 | |
| INVENTOR(S) | : Rief et al. | |

It is certified that error appears in the above-identified patent and that said Letters Patent is hereby corrected as shown below:

Column 4, line 16, after "element" insert --.--.

Column 4, line 45, delete "element" insert --element,--.

Column 11, line 4, delete "or" insert --of--.

Column 13, line 24, delete "camping" insert --clamping--.

Column 14, line 24, delete "damping" insert --clamping--.

Column 14, line 37, delete "ft" insert --it--.

Column 17, line 57, Claim 21, delete "damping" insert --clamping--.

Column 17, line 58, Claim 21, delete "damping" insert --clamping--.

Column 18, line 54, Claim 29, delete "a least" insert --at least--.

Signed and Sealed this

Sixteenth Day of February, 2010

David J. Kappos
*Director of the United States Patent and Trademark Office*